(12) United States Patent
Hempel et al.

(10) Patent No.: US 8,357,575 B2
(45) Date of Patent: Jan. 22, 2013

(54) TECHNIQUE FOR EXPOSING A PLACEHOLDER MATERIAL IN A REPLACEMENT GATE APPROACH BY MODIFYING A REMOVAL RATE OF STRESSED DIELECTRIC OVERLAYERS

(75) Inventors: Klaus Hempel, Dresden (DE); Patrick Press, Dresden (DE); Vivien Schroeder, Ottendorf-Okrilla (DE); Berthold Reimer, Dresden (DE); Johannes Groschopf, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/550,435

(22) Filed: Jul. 16, 2012

(65) Prior Publication Data

US 2012/0282764 A1 Nov. 8, 2012

Related U.S. Application Data

(62) Division of application No. 12/822,789, filed on Jun. 24, 2010, now Pat. No. 8,247,281.

(30) Foreign Application Priority Data

Jun. 30, 2009 (DE) .......................... 10 2009 031 113

(51) Int. Cl.
*H01L 21/8238* (2006.01)

(52) U.S. Cl. .. 438/199; 438/633; 438/692; 257/E21.632

(58) Field of Classification Search .................. 438/199, 438/301, 303, 631, 633–634, 689, 692, 694, 438/695, 697; 257/E21.632
See application file for complete search history.

(56) References Cited

U.S. PATENT DOCUMENTS

| 6,713,385 | B1 | 3/2004 | Pipes et al. ..................... 438/637 |
| 7,435,636 | B1 * | 10/2008 | Hanafi ............................ 438/183 |
| 2007/0077765 | A1 | 4/2007 | Prince et al. ................... 438/694 |

FOREIGN PATENT DOCUMENTS

DE 102007046849 A1 4/2009

OTHER PUBLICATIONS

Translation of Official Communication from German Patent Office for German Patent Application No. 10 2009 031 113.0 dated Apr. 1, 2010.

* cited by examiner

*Primary Examiner* — Thanhha Pham
(74) *Attorney, Agent, or Firm* — Williams, Morgan & Amerson, P.C.

(57) ABSTRACT

In a replacement gate approach, the sacrificial gate material is exposed on the basis of enhanced process uniformity, for instance during a wet chemical etch step or a CMP process, by forming a modified portion in the interlayer dielectric material by ion implantation. Consequently, the damaged portion may be removed with an increased removal rate while avoiding the creation of polymer contaminants when applying an etch process or avoiding over-polish time when applying a CMP process.

12 Claims, 5 Drawing Sheets

TECHNIQUE FOR EXPOSING A PLACEHOLDER MATERIAL IN A REPLACEMENT GATE APPROACH BY MODIFYING A REMOVAL RATE OF STRESSED DIELECTRIC OVERLAYERS

CROSS-REFERENCE TO RELATED APPLICATIONS

This application is a divisional of application Ser. No. 12/822,789, filed Jun. 24, 2010 now U.S. Pat. No. 8,247,281.

BACKGROUND OF THE INVENTION

1. Field of the Invention

Generally, the present disclosure relates to the fabrication of sophisticated integrated circuits including transistor elements comprising highly capacitive gate structures on the basis of a high-k gate dielectric material of increased permittivity.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold of the completed transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like.

For this reason, in some approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure.

In a corresponding replacement gate approach, the polysilicon material acting as a sacrificial or placeholder material is removed after depositing at least a portion of the interlayer dielectric material by any appropriate etch techniques. Typically, the interlayer dielectric material may comprise stress-inducing dielectric layers in order to further enhance overall transistor performance. It is well known that a high strain component in the channel region of silicon-based transistors may result in a significant modification of the mobility of the charge carriers and thus of the overall conductivity of the channel region. For this reason, a stress-inducing dielectric material may be placed in close proximity to the transistors in order to provide a desired strain component in the channel regions. Since P-channel transistors and N-channel transistors may require a different type of strain component, the stress-inducing dielectric materials may be provided with a different internal stress level in order to selectively enhance performance of N-channel transistors and P-channel transistors, respectively. The selective provision of an appropriately stressed dielectric material may be accomplished on the basis of the so-called "dual stress liner" approach in which a sequence of deposition and removal processes in combination with an appropriate masking regime is applied in order to position, for instance, a tensile stressed dielectric material above an N-channel transistor and a compressively stressed dielectric material above a P-channel transistor. Frequently, the stress-inducing dielectric materials may be provided in the form of a silicon nitride material, which may be deposited on the basis of well-established process techniques so as to exhibit the desired internal stress level. On the other hand, the different internal stress level obtained by different process parameters of the plasma enhanced chemical vapor deposition (CVD) process may also result in different material characteristics, for instance with respect to the etch resistivity during the subsequent patterning of the interlayer dielectric material. In particular, during the exposure of the sacrificial gate material during the replacement gate approach, the different material characteristic of the stressed dielectric materials may result in a significant degree of process non-uniformity, as will be described in more detail with reference to FIGS. 1a-1b.

FIG. 1a schematically illustrates a cross-sectional view of a semiconductor device 100 in a very advanced manufacturing stage. The semiconductor device 100 comprises a substrate 101 and a silicon-based semiconductor layer 102 formed above the substrate 101. Moreover, a first device region 110A and a second device region 110B may represent areas in and above the semiconductor layer 102 in which a plurality of circuit elements, such as transistors 150A, 150B, are provided. For example, the transistors 150A may represent P-channel transistors while the transistors 150B may represent N-channel transistors. The transistors 150A, 150B may be positioned within the device regions 110A, 110B in accordance with a specific design of the semiconductor device 100, which may strongly be dependent on process specifics of a replacement gate approach, as will be described later on in more detail. The transistors 150A, 150B may comprise a gate electrode structure 160 comprising a sophisticated material stack 161, which typically includes a high-k dielectric material, for instance one of the materials as specified above, in combination with a metal-containing cap material. Furthermore, the gate electrode structure 160 comprises a placeholder or sacrificial material 162 in the form of a silicon material, possibly in combination with a dielectric cap layer 163. As previously explained, in sophisticated applications, a gate length, i.e., a horizontal extension of the gate electrode structure 160, may be 50 nm and less. The gate electrode structure may have formed on sidewalls thereof an offset spacer element 151, such as a silicon nitride spacer, which may reliably protect sidewalls of sensitive materials in the layer 161. Moreover, a spacer structure 152 is typically provided, such as a silicon nitride spacer material, possibly in combination with an etch stop liner (not shown). Furthermore, the transistors 150A, 150B comprise drain and source regions 154 and a channel region 153, the conductivity of which is to be increased by inducing a certain strain component, as discussed above. Additionally, the drain and source regions 154 may comprise metal silicide regions 155. It should be appreciated that, for convenience, the configuration of the transistors 150A, 150B is illustrated identically for these devices, while, however, in an actual implementation, differences may exist, in particular with respect to the type of doping of the drain and source regions 154 and the channel region 153. Furthermore, in the manufacturing stage shown, the device 100 comprises an interlayer dielectric material or at least a portion thereof, as indicated by 170, which includes a first stress inducing layer 171A having an internal stress level so as to increase performance of the transistors 150A. Similarly, the interlayer dielectric material 170 comprises a second stress-inducing layer 171B having an internal stress level that is appropriate for increasing performance of the transistors 150B. Typically, the materials 171A, 171B may be comprised of silicon nitride of different material composition, for instance with respect to the contents of other species, such as hydrogen and the like. The interlayer dielectric material may comprise a dielectric material 172, such as silicon dioxide, as is frequently used as an efficient interlayer dielectric material.

The semiconductor device 100 may be formed on the basis of any well-established manufacturing strategy in accordance with a replacement gate approach. That is, after defining appropriate active regions for the device areas 110A, 110B by forming isolation structures (not shown), the gate electrode structures 160 are formed by depositing or otherwise forming the layer 161 in combination with the sacrificial silicon material 162 and the cap layer 163. If required, other materials, such as an anti-reflective coating (ARC) material, a hard mask material and the like, may be deposited. Next, the resulting layer stack is patterned by using advanced lithography and etch techniques, thereby obtaining the gate electrode structures 160 with the desired critical dimension. Thereafter, the spacer element 151 may be formed, followed by implantation of appropriate dopant species in combination with the formation of the spacer structure 152 in order to appropriately define the final dopant profile of the drain and source regions 154. After activating the dopant species, the metal silicide regions 155 are formed by applying well-established process techniques. Next, the layers 171A, 171B are formed by depositing a dielectric material, such as a silicon nitride material, having a desired stress level, partially removing the material and depositing a further silicon nitride material having the other type of internal stress. Thereafter, an unwanted portion of the second silicon nitride layer is removed, thereby providing the layers 171A, 171B selectively above the transistors 150A, 150B, respectively. Thereafter, the dielectric material 172 is deposited, thereby obtaining the configuration as shown in FIG. 1a. Thus, the basic transistor configuration is completed, whereas, however, the gate electrode structures 160 may still require an appropriate adaptation of the work function for the transistors 150A, 150B and the provision of a highly conductive metal-containing electrode material. For this purpose, the sacrificial polysilicon material 162 is to be exposed in order to enable an efficient removal thereof.

During the removal of a portion of the material 170 for exposing the polysilicon material 162, however, undue material erosion, also referred to as "dishing," between the gate electrode structures 160 is to be avoided when applying advanced polishing techniques, since, during the subsequent replacement of the polysilicon material 162, a corresponding metal-containing material may remain between the electrode structures 160 and may result in enhanced leakage currents or complete failure of the structure.

FIG. 1b schematically illustrates the semiconductor device 100 during a corresponding removal process 103 during which the layer 172 may be planarized in an initial step, followed by a polishing step for removing material of the layers 171A, 171B and of the layer 172. During the removal process 103, the different material characteristics of the layer 171A, 171B caused by the difference in deposition parameters and thus internal stress level, and the removal of the material 172 provided in the form of a silicon dioxide material may result in different removal rates, thereby contributing to a pronounced non-uniformity. For example, dishing may occur between the gate electrode structures, as indicated by the dashed lines 173, wherein the degree of dishing 173 may even vary with respect to the regions 110A, 110B due to the different material characteristics of the layers 171A, 171B. Furthermore, the removal rate may significantly depend on the distribution of circuit features in the device regions 110A, 110B, that is, for instance, on the distribution of the gate electrode structures 160 and the size thereof, so that large polysilicon areas may suffer from a significant degree of over-polish in order to reliably expose the polysilicon material 162 in other device areas. Due to this pattern dependent removal behavior, frequently, a specifically designed layout is used in order to obtain a desired degree of uniformity across an entire die and also an entire substrate. However, a corresponding specific design may contribute to a very restricted flexibility in designing complex integrated circuits.

After the removal process 103, during which the polysilicon material 162 is exposed, an appropriate etch process may be performed in order to remove the polysilicon material 162 and appropriate metal-containing materials for the gate electrode structures 160 of the transistors 150A, 150B, respectively, are deposited in accordance with any appropriate manufacturing sequence.

In other conventional approaches, the restrictions with respect to circuit design and the like of the removal process 103 may be reduced by applying a "non-selective" plasma-based etch process in order to remove the material of the planarized layer 172 in combination with the layers 171A, 171B and the cap layers 163 (FIG. 1a). However, during the plasma-based etch process having the desired degree of non-selectivity, polymer components may deposit on and in the increasingly exposed polysilicon material 162, which may result in a certain contamination and thus non-uniformity during the subsequent process to be performed for removing the polysilicon material 162, in particular when very efficient wet chemical etch strategies are considered. Consequently, in this case, significant non-uniformities may be introduced due to significantly affecting the further processing when replacing the polysilicon material 162 with metal-containing electrode materials.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques in which a placeholder material or sacrificial material of gate electrode structures may be replaced in a late manufacturing stage on the basis of superior process conditions, while also providing enhanced flexibility in designing complex integrated circuits. To this end, the interlayer dielectric material may be appropriately modified so as to provide a more uniform removal rate of the different materials included in the interlayer dielectric material when exposing the sacrificial material of the gate electrode structures. The efficient modification of the various materials in the interlayer dielectric material may, according to some illustrative embodiments disclosed herein, be accomplished by an ion bombardment, which may result in a significant damage of the materials, thereby contributing to a significant degree of "equalization" of the removal rate of the various materials. In some illustrative aspects disclosed herein, the interlayer dielectric material may comprise differently stressed dielectric layers in order to enhance performance of different types of transistors, thereby enabling an efficient continuation of the replacement gate approach without being restricted to specific circuit layouts, while at the same time overall process uniformity may be increased.

One illustrative method disclosed herein comprises forming a dielectric layer stack above a first gate electrode structure of a first transistor and above a second gate electrode structure of a second transistor, wherein the first and second gate electrode structures comprise a gate insulation layer including a high-k dielectric material and a placeholder material formed above the high-k dielectric material. The method further comprises planarizing a surface topography of the dielectric layer stack to provide a planarized surface. The method additionally comprises forming a modified zone in the dielectric layer stack that has an increased removal rate compared to a non-modified portion of the dielectric layer stack. Additionally, the method comprises performing a material removal process to remove at least a portion of the modified zone and to expose a surface of the placeholder material of the first and second gate electrode structures. Moreover, the placeholder material is replaced in the first and second gate electrode structures by a metal-containing electrode material.

A further illustrative method disclosed herein comprises forming a first stress-inducing layer above a first gate electrode structure and forming a second stress-inducing layer above a second gate electrode structure of a semiconductor device. Additionally, the method comprises forming a planarized dielectric material layer above at least a portion of the first and second stress-inducing layers. The method further comprises performing an ion implantation process to introduce an implantation species into a portion of the planarized dielectric material layer and a portion of the first and second stress-inducing layers. The method additionally comprises performing a material removal process after the ion implantation process in order to expose a sacrificial material of the first and second gate electrode structures. Finally, the sacrificial material is replaced with a metal-containing electrode material.

A still further illustrative method disclosed herein comprises planarizing a dielectric material formed above a first stress-inducing layer and a second stress-inducing layer so as to expose a portion of the first stress-inducing layer formed above a first gate electrode structure and to expose a portion of the second stress-inducing layer formed above a second gate electrode structure. The method further comprises implanting an implantation species into the dielectric material and the portions of the first and second stress-inducing layers after planarizing the dielectric material. Additionally, the method comprises removing material of the dielectric material and the first and second stress-inducing layers to expose a sacrificial material of the first and second gate electrode structures, wherein the material comprises the implantation species.

BRIEF DESCRIPTION OF THE DRAWINGS

The disclosure may be understood by reference to the following description taken in conjunction with the accompanying drawings, in which like reference numerals identify like elements, and in which.

Figure 1A:
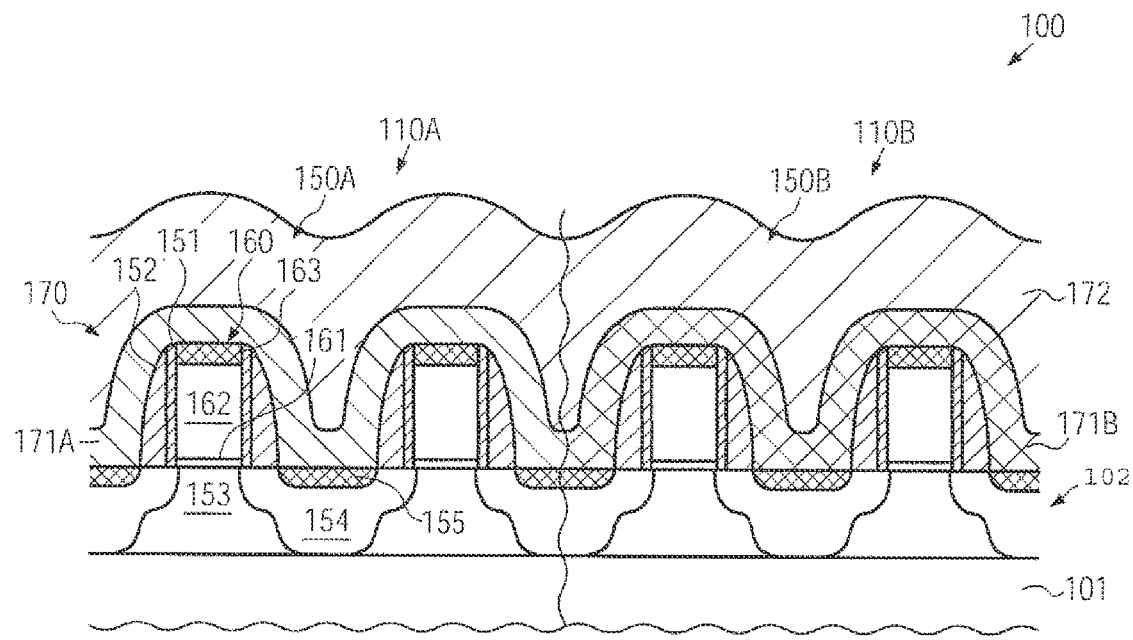
FIGS. 1a-1b schematically illustrate cross-sectional views of a semiconductor device during a conventional replacement gate approach resulting in restrictions with respect to circuit layout and/or in process non-uniformities.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The principles disclosed herein provide techniques in which the interlayer dielectric material may be efficiently modified down to a desired depth in order to provide a substantially "matched" or equalized removal rate of the different materials provided in the modified zone during a subsequent process for exposing a placeholder material or sacrificial material of gate electrode structures. Due to the modification of the material characteristics prior to performing the removal process, superior process conditions may be achieved for a desired type of removal process, such as a planarization process based on a polishing process, a wet chemical etch process, or a combination thereof, without requiring sophisticated redesigns of complex integrated circuits in view of a replacement gate approach. Consequently, stress-inducing dielectric materials of different types of internal stress may be efficiently combined with replacement gate approaches while still maintaining a high degree of design flexibility and reducing the probability of causing process-related non-uniformities. By modifying the interlayer dielectric material down to a specified depth, for instance down to approximately a height level substantially corresponding to the surface of the sacrificial material, the removal rate of different materials in the damaged zone may be "matched" to each other, and, at the same time, a moderately pronounced "selectivity" to the non-modified portion may be accomplished. For example, the removal rate during a polishing process may be made very similar for the different materials, for instance by using an ion implantation process, while at the same time the remaining portion may exhibit a substantially lower removal rate, thereby acting as an efficient polishing stop material. Consequently, overall uniformity may be enhanced across entire die regions, even for a pronounced difference in pattern distribution, while also reducing the degree of dishing between adjacent gate electrode structures due to the "stop capabilities" of the non-modified materials. In still other illustrative embodiments, the removal process to be performed after the modification may be performed on the basis of a wet chemical etch step, wherein the modification may provide a very similar etch rate of the different materials present in the interlayer dielectric material. Consequently, the placeholder material may be efficiently exposed during the wet chemical etch process substantially without contaminating the placeholder material with organic residues, as may be the case in conventional approaches using non-selective plasma assisted etch recipes. Consequently, the further processing may be continued by applying very efficient etch techniques for removing the placeholder material, for instance wet chemical etch steps, since a pronounced contamination with organic materials which may otherwise significantly influence uniformity of wet chemical etch processes may be substantially avoided.

Figure 1B:
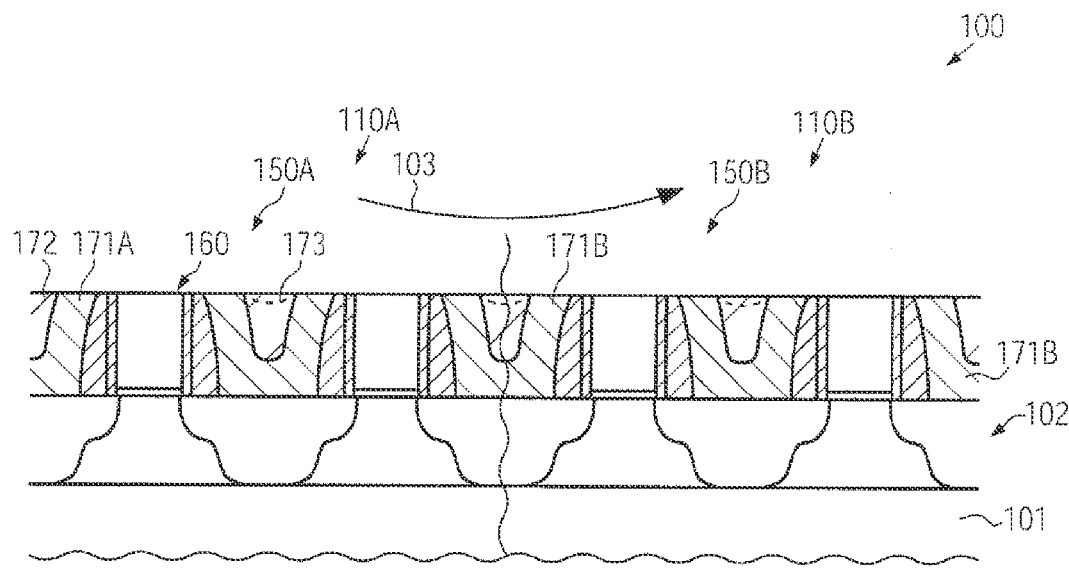

With reference to FIGS. 2a-2h, further illustrative embodiments will now be described in more detail, wherein reference may also be made to FIGS. 1a-1b, if appropriate.

Figure 2A:
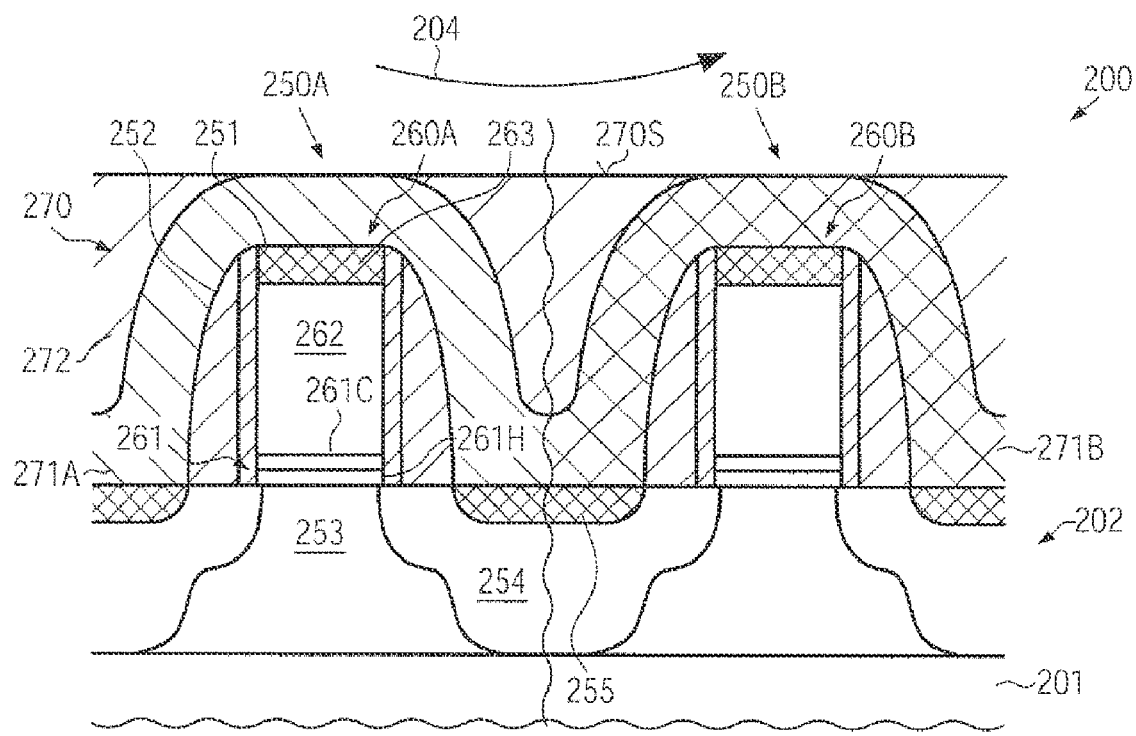
FIG. 2a schematically illustrates a cross-sectional view of a semiconductor device during a planarization process for providing a planarized surface of an interlayer dielectric material, according to illustrative embodiments.

FIG. 2a schematically illustrates a semiconductor device 200 comprising a substrate 201 and a semiconductor layer 202 formed above the substrate 201. The substrate 201 and the semiconductor layer 202 may be provided in the form of any appropriate configuration for forming circuit elements, such as transistors 250A, 250B. For example, the semiconductor layer 202 may represent a silicon-based material, the electronic characteristics of which may be enhanced on the basis of a strain component that may be locally provided in the transistors 250A, 250B, as is also explained with reference to the semiconductor device 100. It should be appreciated that the semiconductor layer 202 may comprise other components, such as germanium, carbon and the like, possibly in combination with a silicon species, in order to obtain the desired characteristics. Furthermore, a buried insulating layer (not shown) may be formed between the semiconductor layer 202 and the substrate 201 if a silicon-on-insulator (SOI) architecture is considered. Furthermore, in the manufacturing stage shown, the basic configuration of the transistors 250A, 250B may be completed, i.e., respective drain and source regions 254 may be formed so as to laterally enclose a channel region 253, and metal silicide regions 255 may be formed in a portion of the drain and source regions 254. It should be appreciated that the drain and source regions 254 may be different for the transistors 250A, 250B, depending on the conductivity type thereof and the overall transistor configuration. In one illustrative embodiment, the transistor 250A may represent a P-channel transistor requiring a certain type of strain in the channel region 253 in order to enhance performance thereof, while the transistor 250B may represent an N-channel transistor requiring a different type of strain. Moreover, the transistors 250A, 250B may comprise gate electrode structures 260A, 260B including a placeholder material or sacrificial material 262, for instance in the form of polysilicon, germanium and the like, which is to be removed in a later manufacturing stage. Furthermore, the gate electrode structures 260A, 260B may comprise a layer 261 that separates the placeholder material 262 from the channel region 253. For example, the layer 261 may comprise a gate dielectric material 261H, which may include any appropriate high-k dielectric material, possibly in combination with a conventional dielectric material, such as silicon oxide based materials and the like. Furthermore, the layer 261 may comprise a metal-containing cap layer 261C, such as a titanium nitride material, an aluminum-based material and the like. Moreover, in the embodiment shown, a cap layer 263 may be formed on the place holder material 262. In addition, an offset spacer element 251 and a spacer structure 252 may be formed on sidewalls of the gate electrode structures 260A, 260B. Additionally, a dielectric material 270, which may comprise a stress-inducing layer 271A formed above the transistor 250A and a stress-inducing layer 271B formed above the transistor 250B, may be provided so as to enclose and passivate the transistors 250A, 250B. As previously explained, the layers 271A, 271B may be comprised of any appropriate dielectric material, such as silicon nitride, nitrogen-containing silicon carbide and the like, and may have a different type of internal stress level in order to selectively create the desired type of strain in the channel regions 253. Additionally, the dielectric material 270 may comprise a layer 272, such as a silicon dioxide material and the like.

When forming the semiconductor device 200, the transistors 250A, 250B may be formed on the basis of any well-established process strategies, for instance using techniques as previously described with reference to the transistors 150A, 150B of FIGS. 1a-1b. It should be appreciated, however, that a specific design in view of appropriately distributing circuit features, such as the gate electrode structures 260A, 260B in view of pattern density, may not be required due to a superior process strategy for exposing the sacrificial material 262. After completing the basic transistor configuration, the dielectric layer stack 270 may be formed by using any appropriate deposition and patterning regime for forming the layers 271A, 271B. It should be appreciated that one or both of the layers 271A, 271B may be formed on a corresponding etch stop liner (not shown), if deemed appropriate. In other cases, an etch stop material may be formed on one or both of the materials 271A, 271B prior to the deposition of the dielectric layer 272. After forming the dielectric layer stack 270, a planarization process 204 may be performed, which may comprise a polishing process, such as a chemical mechanical polishing (CMP) process, in order to remove the material of the layer 272 selectively with respect to the materials 271A, 271B. For instance, a plurality of well-established CMP recipes are available for removing silicon dioxide selectively to silicon nitride based materials, for instance by using fixed abrasives in combination with appropriately set process parameters, thereby obtaining a high degree of uniformity across individual die regions and across the entire substrate 201. Appropriate process parameters may thus be determined on the basis of well-established recipes and on the basis of experiments and the like. Consequently, during the removal process 204, a planarized surface 270S may be obtained wherein the materials 271A, 271B may be exposed and may act as efficient stop layers.

Figure 2B:
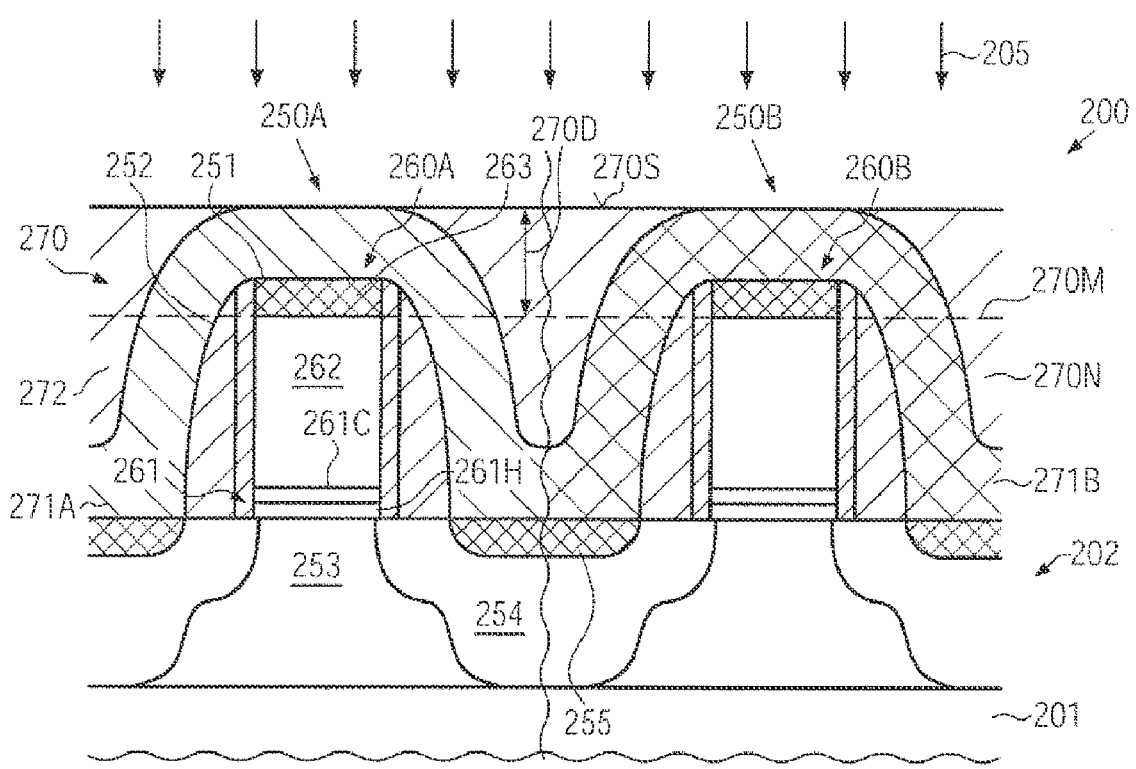
FIG. 2b schematically illustrates a modification process performed on the basis of the planarized surface in order to "equalize" the removal rate of a modified or damaged zone, according to illustrative embodiments.

FIG. 2b schematically illustrates the semiconductor device 200 in a further advanced manufacturing stage in which a modification process 205, such as an ion implantation process, may be performed in order to generate a modified or damaged zone 270M within the dielectric layer stack 270. The damaged zone 270M may have a specified thickness 270D wherein, however, it should be appreciated that a gradual transition between the modified portion 270M and a non-modified portion 270N may exist due to the nature of the modification process 205. For example, in an ion implantation process, the concentration of an implant species may drop within several nanometers by one or two orders of magnitude, depending on the implantation parameters, the implantation species and the materials of the layer stack 270. In this context, the thickness 270D may be considered as an area in which a peak concentration decreases by two orders of magnitude. That is, if, for example, a peak concentration of an implantation species introduced during the process 205 amounts to approximately $10^{19}$ per $cm^3$, the depth 270D may be defined as the area in which the concentration is equal to or higher than 217 per $cm^3$. In some illustrative embodiments, as for instance shown in FIG. 2b, the damaged zone begins at the planarized surface 270S and extends into the depth of the layer stack 270. In further illustrative embodiments, the depth 270D may be selected to correspond at least to a surface of the placeholder material 262, i.e., an interface formed between the material 262 and the cap layer 263. In this case, the removal rate in the damaged zone 270M may be increased down to the material 262, thereby enabling an efficient exposure thereof during the subsequent process step. In other cases, a certain degree of reduction in height of the gate electrode structures 260A, 260B may be desired so that the modified zone 270M may extend into the sacrificial material 262.

It should be appreciated that the modification process 205 may be performed on the basis of any appropriate process parameters, such as implantation energy and dose, if an implantation process is considered, which may be readily established by performing a simulation calculation and/or experiment. For example, specific process parameters may be established for a plurality of implantation species, such as germanium, silicon and the like. In one illustrative embodiment, an efficient "amorphization," that is, a significant damaging of the molecular structure of the materials within the zone 270M, may be accomplished by using xenon as an implantation species, which may provide heavy damage at a moderately low implantation dose, thereby enhancing overall throughput of the process 205. It should be appreciated that, due to the nature of the process 205 and the high degree of uniformity of the preceding planarization process 204 (FIG. 2a), the damaged or modified zone 270M may be provided with a high degree of uniformity across the die regions and across entire substrates.

Figure 2C:
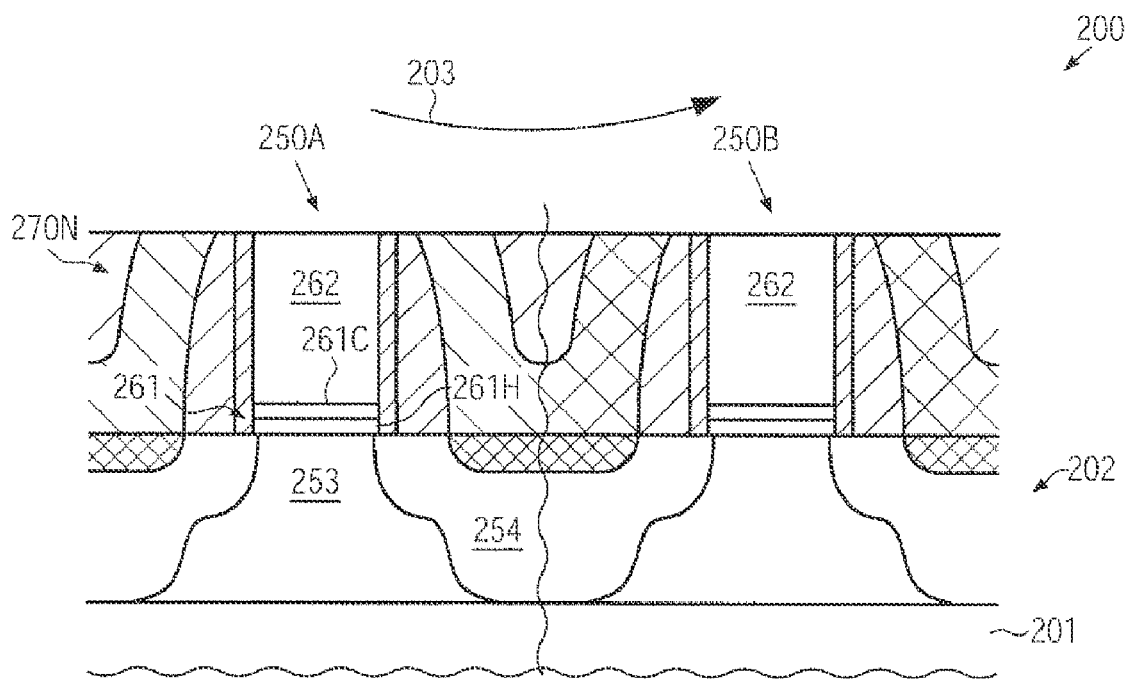
FIG. 2c schematically illustrates a cross-sectional view of the semiconductor device during a material removal process comprising a polishing process in order to expose a sacrificial gate material, according to illustrative embodiments.

FIG. 2c schematically illustrates the semiconductor device 200 during a material removal process 203 in order to remove at least a portion of the damaged zone 270M (FIG. 2b), wherein, in the embodiment shown, the removal process 203 may comprise a polishing process. For this purpose, appropriate process parameters may be applied, for instance designed for removing materials of reduced hardness compared to silicon dioxide materials and/or silicon nitride materials, since the removal rate of the damaged material portions may be significantly higher compared to the non-modified portion 270N. It should be appreciated that appropriate process parameters may be readily established by performing experiments with materials having a desired degree of damaging caused by the preceding process 205 of FIG. 2b. Consequently, during the process 203, the placeholder materials 262 may be efficiently exposed with a high degree of process uniformity, irrespective of the specific pattern distribution within the substrate 201. That is, due to a significant difference in the removal rate between the modified portion and the non-modified portion 270N, any pattern related removal rate variations may be significantly less pronounced, in particular as the portion 270N may act as a stop material in which a pronounced erosion may not occur in view of the process parameters used for removing the modified portion having the significantly increased removal rate. Consequently, exposure of the sacrificial material 262 may be reliably accomplished as long as the modified portion extends to or into the material 262. Furthermore, if desired, a certain degree of height reduction may be accomplished in a highly controllable manner by appropriately adjusting the depth 270D of the modified portion 270M (see FIG. 2b).

Figure 2D:
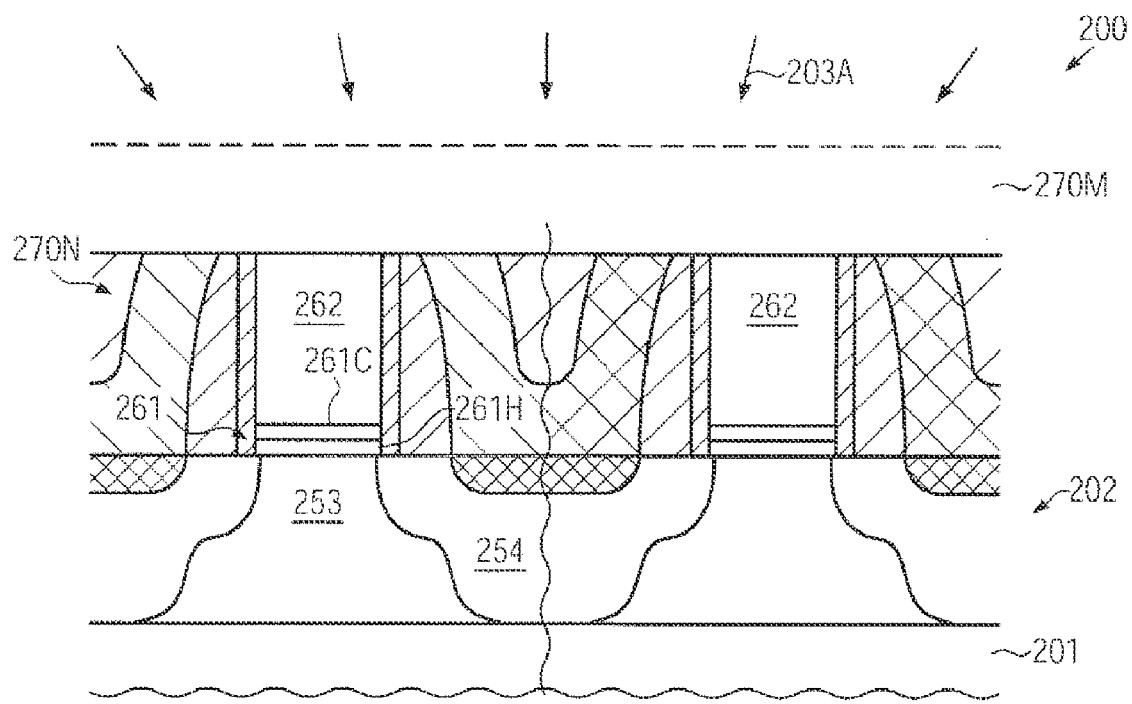
FIG. 2d schematically illustrates a removal process comprising a wet chemical etch process for removing at least a portion of the damaged or modified zone in order to expose the sacrificial gate material, according to still other illustrative embodiments.

FIG. 2d schematically illustrates the semiconductor device 200 according to further illustrative embodiments in which a material removal process 203A may comprise a wet chemical etch process. That is, due to the presence of the modified portion 270M, a substantially equalized removal rate for the different materials in the layer stack 270 may be obtained on the basis of a plurality of wet chemical etch recipes, such as hot diluted hydrofluoric acid (HF), sulphuric acid ($H_3PO_4$), HFEG and the like. In this case, the modified zone 270M may be efficiently removed without creating pronounced organic contaminants, while the etch process may be stopped on and in the non-modified portion 270N, which thus acts as an efficient etch stop layer. In other illustrative embodiments, a combination of the processes 203 and 203A may be applied, for instance, by first performing a polishing process and removing a final portion of the zone 270M by a wet chemical etch step, which may additionally result in an appropriate cleaning of an exposed surface area.

Figure 2E:
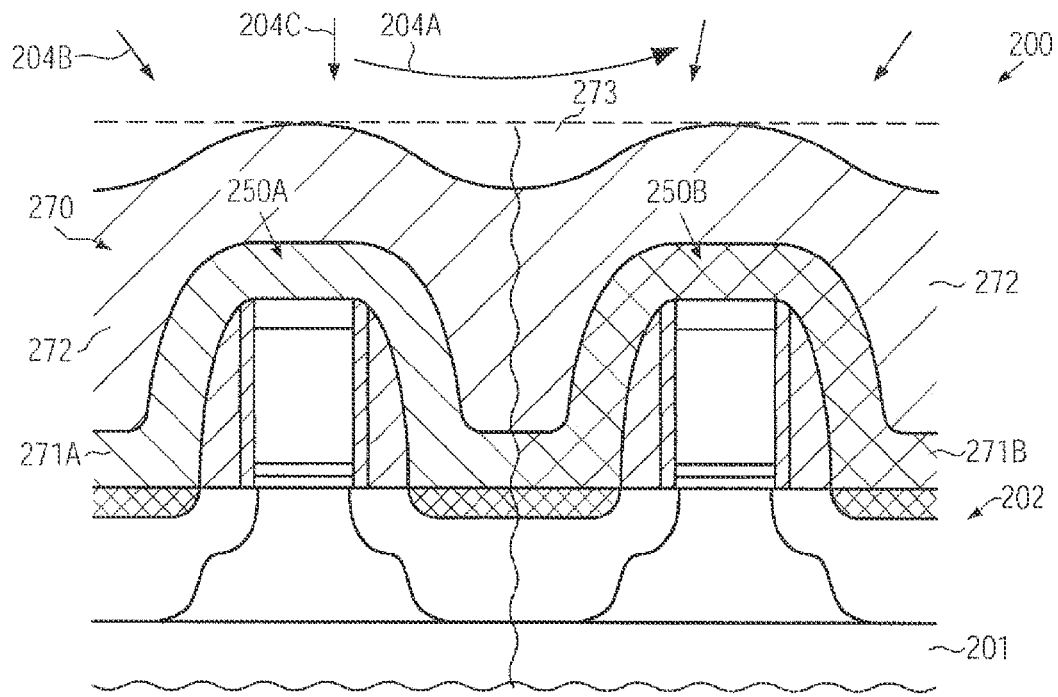
FIGS. 2e-2f schematically illustrate cross-sectional views of the semiconductor device according to still other illustrative embodiments in which planarization of an interlayer dielectric material may be accomplished without exposing stress-inducing layers.

FIG. 2e schematically illustrates the semiconductor device 200 according to further illustrative embodiments. As illustrated, the layer stack 270 is formed above the transistors 250A, 250B with a specific surface topography as may be obtained after deposition of the layer 272. In the embodiment shown, one or more of planarization processes 204A, 204B, 204C may be applied in order to provide a planarized surface, however, without exposing the layers 271A, 271B. For example, the removal process 204A may represent a CMP process performed on the basis of any appropriate process recipe for efficiently removing material of the layer 272, for instance in the form of silicon dioxide. In this case, the removal process 204A may be stopped after an amount of material has been removed from the layer 270. In other illustrative embodiments, a planarization material 273 may be provided, for instance in the form of a polymer material and the like, thereby obtaining a substantially planar surface topography. Thereafter, an isotropic etch process, such as the process 204B, or an anisotropic process such as the process 204A, may be applied in which a removal rate for the planarization layer 273 and the layer 272 may be substantially equal. For example, a plurality of anisotropic etch recipes are available with respect to silicon dioxide and appropriate planarization materials, which may be applied on the basis of spin-on techniques and the like. It should be appreciated that the presence of any polymer residues may be less critical in this case since these residues may be efficiently removed during the further processing.

Figure 2F:
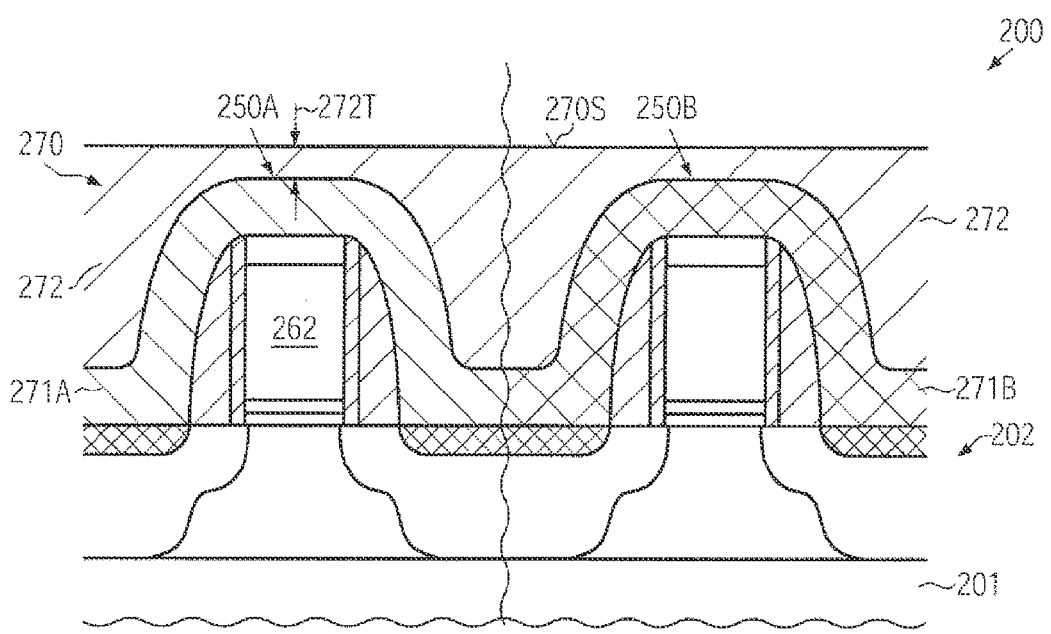

FIG. 2f schematically illustrates the semiconductor device 200 with the planarized surface 270S that is formed within the material 272, that is, a residual thickness 272T may still be provided above the materials 271A, 271B after forming the planarized surface 270S.

Based on the planarized surface 270S, the further processing may be continued by forming a modified portion, as previously described with reference to FIG. 2b, and removing at least a portion of the modified zone in order to expose the materials 262, as described above.

Figure 2G:
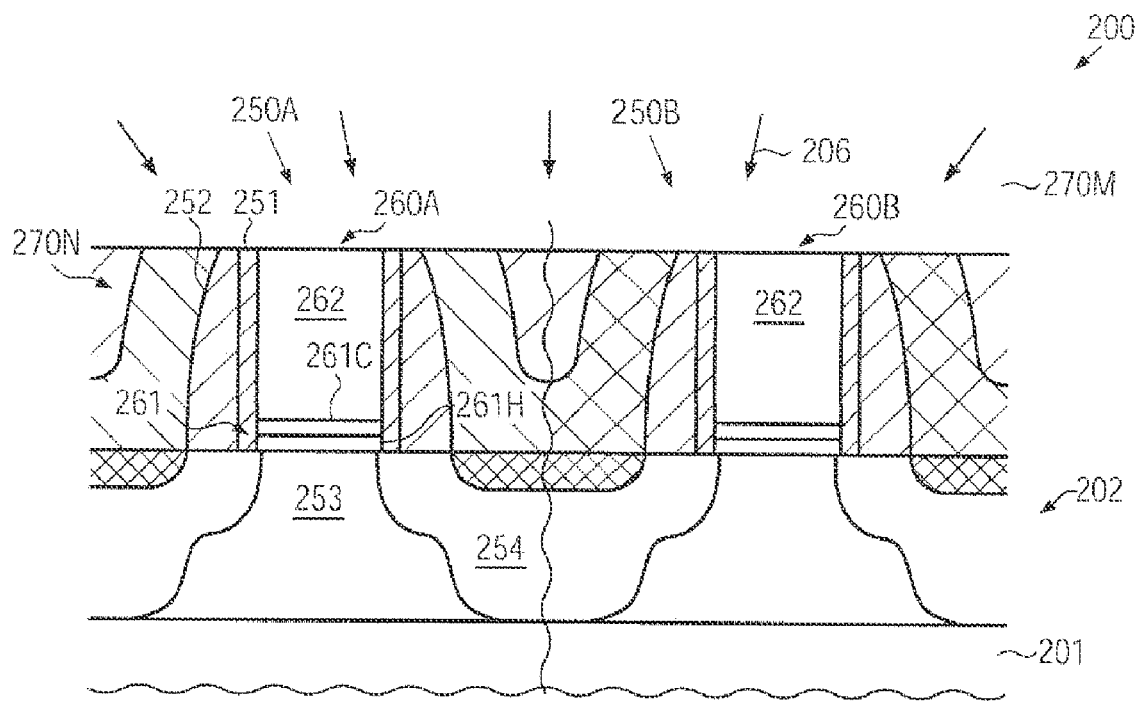
FIGS. 2g-2h schematically illustrate cross-sectional views of the semiconductor device in further advanced manufacturing stages in replacing the sacrificial gate electrode material by a metal-containing electrode material, according to still further illustrative embodiments.

FIG. 2g schematically illustrates the semiconductor device 200 in a further advanced manufacturing stage. As illustrated, after exposing the placeholder material 262 in a highly uniform manner due to the provision of the modified zone, as described above, the device 200 may be exposed to a reactive etch ambient 206 that is established to remove the material 262 selectively with respect to the offset spacer 251 and/or the spacer structure 252 and to the layer 261. As explained above, since the material 262 may be exposed without causing a significant contamination with organic materials, in some illustrative embodiments, very selective wet chemical etch chemistries may be used during the process 206. For example, TMAH (tetramethyl ammonium hydroxide) may be applied at an elevated temperature and at an appropriate concentration, which may thus efficiently remove silicon material selectively with respect to silicon nitride and silicon dioxide. Furthermore, the etch process 206 may be reliably stopped on the layer 261, or on the cap layer 261C. Consequently, after the etch process 206, the further processing, i.e., providing appropriate metal species for adjusting the work functions of the gate electrode structures 260A, 260B and filling in one or more appropriate metal-containing electrode materials, may be continued on the basis of very uniform process conditions.

Figure 2H:
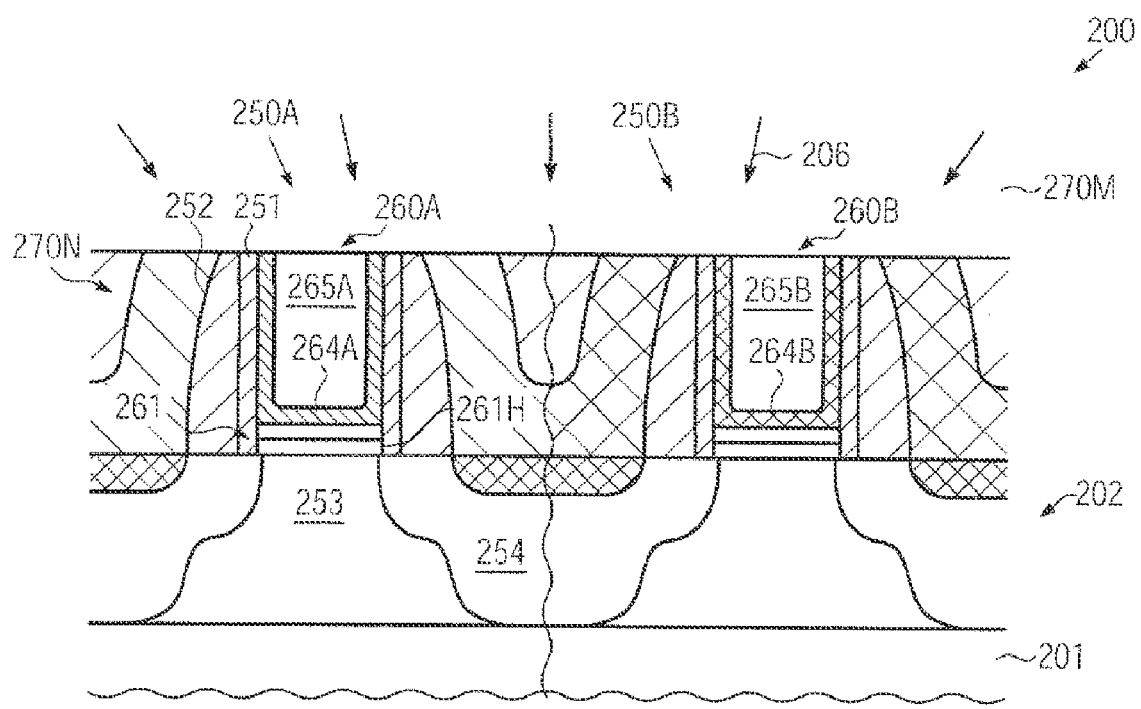

FIG. 2h schematically illustrates the semiconductor device 200 in a further advanced manufacturing stage. As illustrated, the gate electrode structure 260A may comprise a material layer 264A including a metal species for appropriately adjusting the work function, such as aluminum, lanthanum, titanium and the like. Furthermore, a metal-containing electrode material 265A may be provided, for instance in the form of aluminum, tungsten and the like. Similarly, the gate electrode structure 260B may comprise a work function adjusting material layer 264B in combination with a metal-containing electrode material 265B. It should be appreciated that one of the gate electrode structures 260A, 260B may comprise additional materials, such as a barrier material, for instance in the form of tantalum nitride and the like, possibly in combination with a metal species that may also be provided in the other one of the gate electrode structures 260A, 260B. Moreover, two different metal-containing electrode materials may be provided in one or both of the gate electrode structures 260A, 260B, which may depend on the overall process strategy applied to replace the material 262 by a work function adjusting species and a metal-containing electrode material.

The semiconductor device 200 as shown in FIG. 2h may be formed in accordance with any appropriate manufacturing strategy, for instance by first depositing the work function adjusting species for one of the gate electrodes and forming a barrier material (not shown), followed by a removal of these materials from the other gate electrode structure, after which an appropriate electrode material may be deposited. In other cases, one of the gate electrode structures may be appropriately masked in order to fill in a work function adjusting species and a metal-containing electrode material in the other gate electrode structure. Thereafter, the mask may be removed and the other gate electrode structure may receive the work function adjusting species and the electrode material.

As a result, the present disclosure provides techniques in which a placeholder material, such as a polysilicon material and the like, may be efficiently replaced in a later manufacturing stage by forming a modified zone in a planarized dielectric layer stack in order to establish a significantly increased removal rate in the modified zone upon a subsequent removal process for exposing the placeholder materials. Consequently, a superior flexibility in providing an overall circuit design may be achieved, while at the same time superior process uniformity is obtained, due to avoidance or at least a significant reduction of any material erosion between the gate electrode structures upon exposing the sacrificial material. Thus, highly efficient wet chemical etch recipes may be applied for selectively removing the sacrificial material, which may also contribute to superior process uniformity during the subsequent processing. Furthermore, enhanced controllability of reducing a gate height may be achieved, even if the exposure of the sacrificial gate material may be completely accomplished by using a CMP process, since corresponding over-polish times may be significantly reduced or the effects thereof may be reduced, irrespective of the specific circuit layout.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a first stress-inducing layer above a first gate electrode structure of a first transistor and a second stress-inducing layer above a second gate electrode structure of a second transistor, said first and second gate electrode structures comprising a gate insulation layer including a high-k dielectric material and a placeholder material formed above said high-k dielectric material, wherein said first stress-inducing layer comprises an internal stress that is different from said second stress-inducing layer;
   forming a dielectric material above said first and second stress-inducing layers and above said first and second gate electrode structures;
   planarizing said dielectric material formed above said first stress-inducing layer and said second stress-inducing layer so as to expose a portion of said first stress-inducing layer and a portion of said second stress-inducing layer;

implanting an implantation species into said dielectric material and said portions of said first and second stress-inducing layers after planarizing said dielectric material; and removing material of said dielectric material and said first and second stress-inducing layers so as to expose a sacrificial material of said first and second gate electrode structures, said removed material comprising at least a portion of said implantation species.

2. The method of claim 1, wherein at least one of said first stress-inducing layer and said second stress-inducing layer comprises at least one of silicon nitride and a nitrogen-containing silicon carbide.

3. The method of claim 1, wherein said implantation species comprises at least one of carbon, silicon and germanium.

4. The method of claim 1, wherein said ion implantation process is performed by using xenon as an implantation species.

5. The method of claim 1, wherein removing material of said dielectric material and said first and second stress-inducing layers comprises performing a wet chemical etch process.

6. The method of claim 5, wherein said wet chemical etch process is performed by using at least one of hydrofluoric acid (HF) and sulphuric acid ($H_3PO_4$).

7. The method of claim 1, wherein removing material of said dielectric material and said first and second stress-inducing layers comprises performing a planarization process.

8. The method of claim 1, wherein planarizing said dielectric material comprises performing a planarization process and using said first and second stress-inducing layers as stop layers for controlling said planarization process.

9. A method, comprising:

forming a first gate electrode structure and a second gate electrode structure, each of said first and second gate electrode structures comprising a sacrificial material;

forming first and second stress inducing layers above said first and second gate electrode structures, respectively;

forming a dielectric material above said first and second stress-inducing layers;

planarizing said dielectric material so as to expose a portion of said first stress-inducing layer and a portion of said second stress-inducing layer;

implanting an implantation species into said dielectric material and at least said exposed portions of said first and second stress-inducing layers after planarizing said dielectric material; and removing material of said dielectric material and said first and second stress-inducing layers so as to expose said sacrificial material of said first and second gate electrode structures, said removed material comprising at least a portion of said implantation species.

10. The method of claim 9, wherein removing said material comprises performing a wet chemical etch process.

11. The method of claim 9, wherein removing said material comprises performing a polishing process.

12. The method of claim 9, further comprising replacing at least one of said sacrificial material of said first or said second gate electrode structures with a metal-containing electrode material.

* * * * *